United States Patent [19]

Ohtake et al.

[11] Patent Number: 4,565,755
[45] Date of Patent: Jan. 21, 1986

[54] METHOD OF MANUFACTURING SHADOW MASK

[75] Inventors: Yasuhisa Ōhtake; Hiroshi Tanaka, both of Fukaya, Japan

[73] Assignee: Tokyo Shibaura Denki Kabushiki Kaisha, Kawasaki, Japan

[21] Appl. No.: 583,329

[22] Filed: Feb. 24, 1984

[30] Foreign Application Priority Data

Feb. 28, 1983 [JP] Japan .................................. 58-30835

[51] Int. Cl.$^4$ ........................... G03F 9/00; B41C 1/00
[52] U.S. Cl. .......................................... 430/5; 430/23; 430/320; 430/323; 430/394; 156/640; 156/661.1; 445/47
[58] Field of Search ................. 430/23, 320, 394, 323; 156/661.1, 640; 313/402, 403; 445/47

[56] References Cited

U.S. PATENT DOCUMENTS 2,762,149  9/1956  Mears .................................... 156/640
3,666,462  5/1972  Kaplan .............................. 430/23 X
3,676,914  7/1972  Fiore .................................. 430/23 X Primary Examiner—Mary F. Downey
Assistant Examiner—José G. Dees
Attorney, Agent, or Firm—Cushman, Darby and Cushman

[57] ABSTRACT

A method of manufacturing a shadow mask comprises the steps of: forming photoresist films on two major surfaces of a sheet made of a shadow mask material; forming latent images by selectively exposing the photoresist films, respectively; developing the latent images to form photoresist film patterns, respectively; and spraying an etching solution for etching the shadow mask sheet having the photoresist film patterns onto the two major surfaces thereof to etch bared portions of the shadow mask sheet, wherein the photoresist film formed on one of the two major surfaces of the shadow mask sheet is thicker than that formed on the other of the two major surfaces. The step of spraying the etching solution comprises a first step and a subsequent second step, wherein an impact of the etching solution against the shadow mask sheet in the first step is greater than that in the second step.

4 Claims, 5 Drawing Figures

METHOD OF MANUFACTURING SHADOW MASK

BACKGROUND OF THE INVENTION

The present invention relates to a method of manufacturing a shadow mask for a color picture tube.

A color picture tube of the shadow mask type has a shadow mask which has a plurality of apertures formed at a predetermined pitch and which is disposed close to a phosphor screen. Red, blue and green electron beams from an electron gun of the color picture tube are converged in the vicinity of each aperture and pass through this aperture. The electron beams then land on the corresponding color phosphors to reproduce a color image. When a distortion of the shape of apertures of the shadow mask, or deviations in alignment between the apertures and the corresponding phosphors, or a deviation in a predetermined distance (hereinafter referred to as a "q value") between the shadow mask and the phosphor screen exceed predetermined values, color purity is degraded (hereinafter referred to as a "purity drift"), resulting in a decisive drawback. In order to guarantee that a proportion of each electron beam is obliquely transmitted through each aperture, the aperture has a sectional shape as shown in FIG. 1. More specifically, an opening 2 (large opening) of the aperture of a shadow mask 1 at the side of the phosphor screen has an area three times that of an opening 3 (small opening) thereof at the side of the electron gun. The shadow mask of this type is manufactured as follows. As shown in FIGS. 2A and 2B, photoresist films 4 are formed on two major surfaces of a sheet 1 for forming a shadow mask. Predetermined portions of the photoresist films 4, which correspond to the prospective large and small openings 2 and 3, are exposed through the mask patterns. The exposed structure is developed to remove the portions of the films 4 corresponding to the prospective large and small openings 2 and 3, as shown in FIG. 2B, so that portions of the sheet 1 which correspond to the prospective large and small openings 2 and 3 are bared. When the sheet 1 contains iron as its major constituent, the sheet is etched, using an etching solution having ferric chloride as its major constituent, to form a predetermined aperture, as shown in FIG. 2C. Thereafter, the resist films are removed to obtain a finished flat mask. In the case of the aperture shape shown in FIG. 1, the precision of the minimum aperture size is mostly influenced by etching from the small opening side. However, etching from the large opening side must be controlled. Naturally, an etching rate from the large opening side must be greater than that from the small opening side. Since the etching area at the large opening side is about three times that at the small opening side, replacement between a new solution and a fatigued solution can be properly performed, so that the etching rate at the large opening side is greater than that at the small opening side, thereby satisfying the above condition to some extent. However, since the etching rate from the large opening side is great, side etching is also promoted. As a result, an overhang or projection 5 of the photoresist film 4 is formed to float on the sheet 1, as shown in FIG. 2C. The overhang 5 often becomes peeled off or damaged due to an impact strength of the etching solution on the sheet 1. As a result, a sheet portion from which the resist film has been damaged or peeled off, is subjected to further etching, with the result that the aperture size is distorted, thereby degrading the quality of the shadow mask. This tendency typically occurs in a high-precision micropatterned color picture tube wherein an aperture pitch and an aperture size are small, or wherein the thickness of the sheet is increased and the etching amount is increased.

In such a color picture tube, about ⅔ or more of the electron beams are bombarded against the shadow mask without being transmitted through the apertures. As a result, the shadow mask is thermally expanded, and the q value changes, so that color purity is again degraded. The dome phenomenon, resulting from thermal expansion of the shadow mask, occurs less frequently when a radius of curvature of an effective area of the shadow mask is small, since the tolerance of the electron beams can be increased. However, the radius of curvature of the effective area of the shadow mask is the same as that of the faceplate, and it is difficult for an observer to see an image on the screen when the radius of curvature is small. For this reason, the radius of curvature must be increased as far as possible. Any resultant dome phenomenon must be prevented. For this purpose, heat radiation properties of the shadow mask may be increased, or heat absorption properties of the phosphor screen may be increased to reduce the dome phenomenon. However, these methods cannot greatly decrease the dome phenomenon, and provide only a small margin of improvement. According to another method, a thickness of a shadow mask sheet is increased to decrease thermal deformation thereof. However, when the thickness of the sheet is increased, etching with high precision cannot be properly performed. For example, the etching time for a sheet having a thickness of 0.3 mm is about three times that for a sheet having a thickness of 0.15 mm. In the case of the sheet having the thickness of 0.3 mm, aperture shape distortion occurs frequently due to damage of the overhang of the resist film.

SUMMARY OF THE INVENTION

The present invention has been made in consideration of the above situation, and has as an object to provide a method of manufacturing a shadow mask which is capable of forming apertures with high precision.

In order to achieve the above object of the present invention, there is provided a method of manufacturing a shadow mask, comprising the steps of forming photoresist films on two major surfaces of a sheet made of a shadow mask material, forming latent images by selectively exposing said photoresist films, respectively, developing said latent images to form photoresist film patterns, respectively, and spraying an etching solution onto said shadow mask sheet having said photoresist film patterns on said two major surfaces thereof to etch bared or exposed portions of said shadow mask sheet, wherein the photoresist film formed on one of said two major surfaces of said shadow mask sheet is thicker than that formed on the other of said two major surfaces. This will reduce or eliminate damage to the overlapping portion of the photoresist film.

The step of spraying the etching solution comprises a first step and a subsequent second step, wherein an impact strength of the etching solution against the shadow mask sheet in the first step is greater than that in the second step.

The first spraying step is preferably performed for the major surface of the shadow mask sheet which has the thicker photoresist film, and the second spraying step is preferably performed for both major surfaces of the shadow mask sheet.

DETAILED DESCRIPTION OF THE PREFERRED EMBODIMENT

Figure 1:
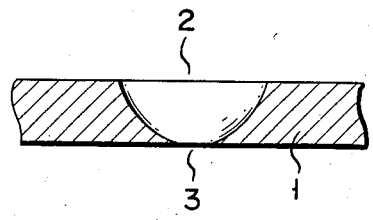
FIG. 1 is a sectional view showing an aperture and its vicinity of a shadow mask.
Figure 2A:
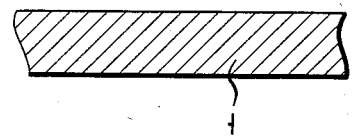
FIGS. 2A to 2C are sectional view for explaining the steps of forming the aperture of the shadow mask.
Figure 2B:
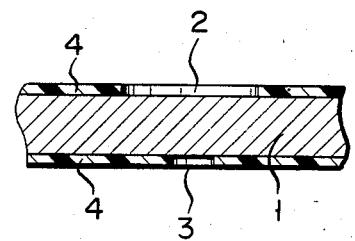
Figure 2C:
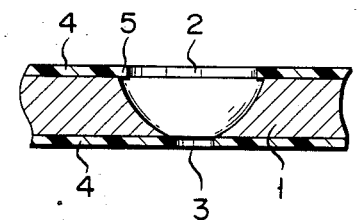

The most important portion of the aperture of the shadow mask is the small opening. In general, the area of the small opening is substantially the same as the minimum aperture size. The proportion of the electron beam passing through the aperture is substantially determined by the minimum aperture size. The precision of the small opening side of the aperture must therefore be strict, and the precision requirement for the large opening side thereof is less strict. Since amount of material to be etched at the large opening side is considerably greater than that at the small opening side, it is preferred that etching is started from the large opening side, and is finally performed from the small opening side to form an aperture. In this case, when side etching and the size of the etched form vary, etching precision from the small opening side also varies. In order to prevent damage of the overhang of the photoresist film at the time of etching, the thickness of the photoresist film must be increased. However, when the thickness is excessively increased, development resolution is degraded and the precision of the aperture is thus degraded. In consideration of the above conditions, a thickness of the photoresist film at the large opening side must be greater than that at the small opening side so as to prevent damage of the overhang of the photoresist film since the etching amount and rate at the large opening side are greater than those at the small opening side, while the photoresist film at the small opening side must have a sufficient thickness to guarantee that the mechanical strength of the overhang is such that it can withstand etching of the corresponding etching rate and amount.

The photoresist film at the large opening side preferably has a thickness falling within the range between 5 $\mu$m and 12 $\mu$m in consideration of the desired mechanical strength of the overhang and an allowance of the development resolution. From similar viewpoints, the photoresist film at the small opening side preferably has a thickness falling within the range between 3 $\mu$m and 6 $\mu$m. Within the above ranges, the photoresist film at the large opening side has a greater thickness than that of the photoresist film at the small opening side in accordance with the aperture pitch, the aperture size and the thickness of the shadow mask sheet.

The etching rate is decreased when a first half etching cycle at the large opening side changes to a second half etching cycle at both the large and small opening sides to obtain a highly precise aperture. More specifically, during the last etching cycle, side etching must be minimized, so that etching at the small opening side which determines the precision of the aperture is performed at a lower etching rate than that of the first half etching cycle, thereby obtaining the desired result. More particularly, the impact of the etching solution sprayed from the etching nozzle onto the shadow mask sheet is set to be 5 to 10 g/cm$^2$ during the first half cycle and is changed to 2.5 to 5.0 g/cm$^2$ during the second half cycle. An example will be described wherein the method of the present invention is applied to a shadow mask having a thickness of 0.3 mm.

Figure 3:
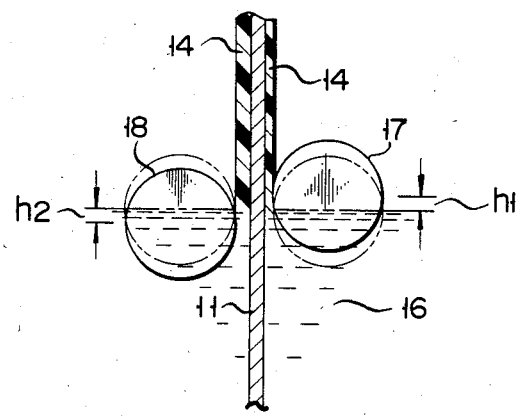
FIG. 3 is a representation for explaining a method of forming photoresist films which is employed in an embodiment of the present invention.

A sensitizer solution of casein alkali and ammonium dichromate as a sensitizer, which latter is added in an amount of about 1 wt% with respect to the casein alkali, is prepared to have a specific gravity of about 1.04 and is applied to the sheet in accordance with the squeeze coater method, as shown in FIG. 3.

A shadow mask sheet 11 is pulled upward through a sensitizer solution 16 between rollers 17 and 18 for controlling thicknesses of photoresist films 14. The rollers 17 and 18 are first set symmetrically at positions indicated by the dotted circles at the same level. The roller 17 is then moved upward such that the center thereof is a distance h1 above the solution level, while the roller 18 is moved downward such that the center thereof is a distance h2 below the solution level. Therefore, the photoresist film 14 at the side of the roller 18 becomes thicker than that at the side of the roller 17. The photoresist films 14 are dried at a temperature of 100° C. for five minutes. When each of the distances h1 and h2 was given to be 1 mm, the thicknesses of the photoresist films were about 5 $\mu$m and 8 $\mu$m, respectively.

The photoresist films 14 are then exposed for about one minute through predetermined negative patterns by a 5-kW mercury lamp spaced apart by about 1 m from the sheet 11. Development is performed such that warm pure water at a temperature of about 40° C. is sprayed at a pressure of 1 kg/cm$^2$. The resultant sheet is dried at a temperature of 150° C. for two minutes and is then burned at a temperature of 200° C. for about 1.5 minutes. The shadow mask sheet is prepared such that portions of the shadow mask sheet which correspond to the openings are bared.

Etching is then performed such that a solution of ferric chloride, which has a temperature of about 67° C. and a specific gravity of about 1.467, is sprayed as an etching solution from a nozzle spaced about 300 mm from the resist film. During the first half etching cycle, etching is performed for about six minutes such that a spray pressure is set at 1.5 to 2.5 kg/cm$^2$ and an impact strength of the etching solution onto the shadow mask at the large opening side of the shadow mask sheet is set to be 5 to 10 g/cm$^2$. In this step, the overhang of the photoresist film which is formed by side etching is small. In addition, even if the impact acting on the resist film is as large as 5 to 10 g/cm$^2$, the resist film can withstand the impact since the etching solution does not pass through the large opening side to the small opening side. During the second half etching cycle, etching is performed for about six minutes such that a spray pressure is set to be 0.5 to 1.5 kg/cm$^2$ and an impact at each of the large and small opening sides of the sheet is set to be 2.5 to 5 g/cm$^2$. In this step, the overhang of the resist film is increased, and the etching solution passes between the large and small openings. The photoresist film at the large opening side is thicker than that at the small opening side, and the impact on this resist film is decreased during the second half etching cycle. Therefore, the overhang will not become unstable and cannot be damaged.

When etching is completed, the remaining photoresist films are removed by washing with water and spraying a 15% solution of NaOH at a temperature of 90° C.

at a pressure of 1 kg/cm² for three minutes. Thereafter, the resultant structure is washed with water and dried, thereby obtaining a flat shadow mask with precise apertures.

The etching solution may be sprayed sequentially from the large and small opening sides or simultaneously, or a combination of sequential and simultaneous spraying operations may be adopted. When spraying is performed from only one of the sides, a leakage preventing apparatus is preferably used to prevent the etching solution from leaking from one side to the other side unless the aperture is formed. The method of the present invention may be applied to the manufacture of shadow masks having a thickness of about 0.1 to about 0.4 mm, including high-precision color picture tube shadow masks having a small aperture size and a short aperture pitch.

According to the method of the present invention, highly precise apertures can be effectively formed in the shadow mask sheet, thus resulting in a variety of industrial applications.

While the present invention has been described with reference to the particular embodiments described above, a person having ordinary skill in the art will appreciate that various changes and modifications may be made thereto without departing from the teachings of the present invention, as set forth in the claims.

What is claimed is:

1. A method of manufacturing a shadow mask, comprising the steps of:

forming photoresist films on first and second surfaces of a sheet made of a shadow mask material;

forming latent images on said first and second surfaces by selectively exposing said photoresist films, respectively;

developing said latent images to form photoresist film patterns on said first and second surfaces, respectively; and spraying an etching solution onto said first and second surfaces to etch bared portions of said shadow mask sheet to form apertures with a large opening side on said first surface and a small opening side on said second surface, wherein the photoresist film formed on said first surface is thicker than the photoresist film formed on said second surface, and wherein said spraying step includes a first spraying step and a second spraying step, wherein an impact strength of the etching solution against the shadow mask sheet in said first step is greater than that in said second step.

2. A method according to claim 1, wherein said impact strength in said first spraying step is 5 to 10 g/cm², and said impact strength in said second spraying step is 2.5 to 5.0 g/cm².

3. A method according to claim 1, wherein said shadow mask sheet has a thickness falling within a range between 0.1 mm and 0.4 mm.

4. A method according to claim 1 wherein said first spraying step is performed only on said first surface and said second spraying step is performed on said first and second surfaces.

* * * * *